(12) United States Patent
Kim et al.

(10) Patent No.: US 8,129,264 B2
(45) Date of Patent: Mar. 6, 2012

(54) METHOD OF FABRICATING A SEMICONDUCTOR DEVICE

(75) Inventors: Jin-Gyun Kim, Yongin-si (KR); Bon-young Koo, Suwon-si (KR); Ki-hyun Hwang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 702 days.

(21) Appl. No.: 12/181,166

(22) Filed: Jul. 28, 2008

(65) Prior Publication Data
US 2009/0042383 A1 Feb. 12, 2009

(30) Foreign Application Priority Data
Aug. 6, 2007 (KR) .................. 10-2007-0078706

(51) Int. Cl.
*H01L 21/4763* (2006.01)
(52) U.S. Cl. ........ 438/619; 438/411; 438/421; 438/783; 257/E21.495
(58) Field of Classification Search .................. 438/411, 438/421, 619, 783
See application file for complete search history.

(56) References Cited

U.S. PATENT DOCUMENTS

| 5,959,337 A | * | 9/1999 | Gardner et al. | 257/410 |
| 2005/0181633 A1 | * | 8/2005 | Hochberg et al. | 438/787 |
| 2006/0216920 A1 | * | 9/2006 | Kojima | 438/618 |
| 2008/0105927 A1 | * | 5/2008 | Ahn et al. | 257/365 |

FOREIGN PATENT DOCUMENTS

| JP | 2000-031278 | 1/2000 |
| KR | 10-0286126 | 9/2000 |
| KR | 2001-0003458 | 1/2001 |

OTHER PUBLICATIONS

Korean Abstract No. 1020000056157 corresponds to Korean Foreign Patent No. 10-0286126.

* cited by examiner

*Primary Examiner* — Alexander Ghyka
(74) *Attorney, Agent, or Firm* — F Chau & Associates, LLC

(57) ABSTRACT

A method of forming a dielectric layer having an air gap to isolate adjacent wirings or a gate stack of the semiconductor device is provided. A method of fabricating a semiconductor device includes providing a semiconductor substrate on which a plurality of wirings are formed adjacent to one another and forming a dielectric layer filling an upper portion of a space between the adjacent wirings to form air gaps by a thermal chemical vapor deposition method.

12 Claims, 2 Drawing Sheets

METHOD OF FABRICATING A SEMICONDUCTOR DEVICE

CROSS-REFERENCE TO RELATED PATENT APPLICATIONS

This application claims the benefit of Korean Patent Application No. 10-2007-0078706, filed on Aug. 6, 2007, the disclosure of which is hereby incorporated by reference herein in its entirety.

BACKGROUND OF THE INVENTION

1. Technical Field

The present disclosure relates to a method of fabricating a semiconductor device, and more particularly, to a method of forming a semiconductor device with a dielectric layer having an air gap to isolate wirings or a gate stack of the semiconductor device.

2. Description of the Related Art

As semiconductor devices such as logic elements, DRAMs, or flash memories are typically highly integrated, the distance between metal wirings in the semiconductor devices may gradually decrease. Capacitive coupling due to a parasitic capacitance generated by the metal wirings and a dielectric layer for isolating the metal wirings may cause an interconnection delay that hinders the integration and high speed of a semiconductor device.

In addition to the interconnection delay, signal interference due to the capacitive coupling may be generated between gate stacks of neighboring cells of a flash memory device. For example, in a flash memory device, during programming or a read operation of a selected flash memory cell, the programming or read operation may fail due to the capacitive coupling of the selected flash memory cell with an unselected flash memory cell.

To reduce the capacitive coupling due to the parasitic capacitance generated between the neighboring metal wirings or memory cells, technologies that involve using of a material having a low dielectric capacitance for the dielectric layer or forming an air gap or void in the dielectric layer, are used. In particular, as the air gap may provide a dielectric capacitance of about 1.0, the capacitive coupling can be effectively reduced. However, the above method of forming the dielectric layer of a material having a low dielectric capacitance or with the air gap may be required to avoid deteriorating or damaging the electrical characteristics of constituent elements, such as, for example, wiring members or gate stacks, that have been already embodied, during the application thereof.

SUMMARY OF THE INVENTION

The exemplary embodiments of the present invention provide a method of fabricating a semiconductor device with a dielectric layer having an air gap which can reduce capacitive coupling effect by reducing the parasitic capacitance between wiring members so that a reliability of a semiconductor device may be improved.

Also, the exemplary embodiments of the present invention provide a method of fabricating a semiconductor device with a dielectric layer having an air gap which can isolate a gate stack of the semiconductor device, without damaging a tunneling dielectric layer and/or a gate dielectric layer in the gate stack.

In accordance with an exemplary embodiment of the present invention, a method of fabricating a semiconductor device is provided. The method includes providing a semiconductor substrate on which a plurality of wirings are formed adjacent to one another and forming a dielectric layer filling an upper portion of a space between the adjacent wirings to form air gaps by a thermal chemical vapor deposition method.

The thermal chemical vapor deposition method may comprise a low pressure chemical vapor deposition method. The low pressure chemical vapor deposition method may be performed at a pressure of about 0.3 Torr to about 10 Torr. The thermal chemical vapor deposition method may use a mixed gas of a silicon-based gas and an oxygen-based gas. The silicon-based gas may comprise diethylsilane (DES) and the oxygen-based gas may comprise any one of $O_2$, $O_3$, NO, $N_2O$, and $H_2O$ or a combination thereof.

In accordance with an exemplary embodiment of the present invention, a method of fabricating a semiconductor device is provided. The method includes providing a semiconductor substrate including a channel region, forming a plurality of adjacent gate stacks, each of the adjacent gate stacks comprising multilayer films on the channel region and forming a dielectric layer filling an upper portion of a space between the adjacent gate stacks to form air gaps by a thermal chemical vapor deposition method.

The thermal chemical vapor deposition method may comprise a low pressure chemical vapor deposition method. The low pressure chemical vapor deposition method may be performed at a pressure of about 0.3 Torr to about 10 Torr. The multilayer films may comprise a tunneling dielectric layer, a charge storage layer, a blocking dielectric layer, and a control gate which are sequentially deposited on the channel region.

According to the method of fabricating a semiconductor device according to exemplary embodiments of the present invention, by depositing an insulating layer for isolating wirings using a thermal chemical vapor deposition method that is performed at a relatively high temperature, impurities that can be induced from a reaction gas and dispersed in a subsequent process, can be included in lesser amounts in the insulating layer in comparison to the conventional art. Thus, the overall reliability of the semiconductor device may be improved.

Also, according to the method of fabricating a semiconductor device according to exemplary embodiments of the present invention, by fabricating an insulating layer using a thermal chemical vapor deposition method, damage to the insulating layer in a gate stack may not occur in comparison with a Plasma Enhanced Chemical Vapor Deposition (PECVD) method used in the conventional art. Thus, a method of fabricating a semiconductor device having improved reliability can be provided.

BRIEF DESCRIPTION OF THE DRAWINGS

Exemplary embodiments of the present invention can be understood in more detail from the following description taken in conjunction with the attached drawings in which.

DETAILED DESCRIPTION OF THE EXEMPLARY EMBODIMENTS OF THE INVENTION

Figure 1A:
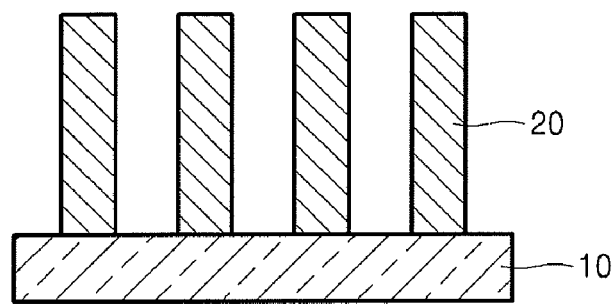
FIGS. 1A to 1C are cross-sectional views of a method of fabricating a semiconductor device, according to an exemplary embodiment of the present invention.

Exemplary embodiments of the present invention are described below in detail with reference to the attached drawings.

The exemplary embodiments of the present invention are provided to a person skilled in the art in the technical field to which the present invention pertains for better explanation of the present invention. The following exemplary embodiments may be modified to various types and the scope of the present invention is not limited to the following embodiments.

In the following description, when a layer is described to exist on another layer, this means that the layer may exist directly on the other layer or a third layer may be interposed therebetween. Also, in the drawings, the thickness or size of each layer is exaggerated for the convenience and clarity of explanation and like reference numerals denote like elements. As in the present specification, the term "and/or" includes any one of listed items or one or more combination thereof.

The terms used in the present specification are used to describe a particular embodiment and are not used to limit the present invention. As in the present specification, a singular form may include a plural form unless the singular form definitely indicated otherwise in the context. Also, in the present specification, the terms "comprise" and/or "comprising" specify existence of shapes, numbers, steps, operations, members, elements, and/or groups thereof, which are referred to, and do not exclude existence or addition of one or more different shapes, numbers, operations, members, elements, and/or groups thereof.

Although in the present specification the terms "first" and "second" are used to describe various members, parts, areas, layers, and/or portions, these members, parts, areas, layers, and/or portions must not be limited by these terms. These terms are used only to distinguish one member, part, area, layer, or portion from another member, part, area, layer, or portion. Thus, the first member, part, area, layer, or portion that is described below may indicate the second member, part, area, layer, or portion without deviating from the concept of the present invention.

The exemplary embodiments of the present invention are described with reference to the attached drawings that schematically illustrate the ideal embodiments of the present invention. In the drawings, for example, according to the manufacturing technology and/or tolerance, the modification of the illustrated shape can be expected. Thus, the exemplary embodiments of the present invention must not be interpreted to be limited by a particular shape that is illustrated in the drawings and must include a change in the shape occurring, for example, during manufacturing.

As used in the present specification, the term "air gap" refers to a space intentionally formed in an insulating layer for isolating members and may be called by a variety of names such as, for example, void, pore, and gap.

Figure 1B:
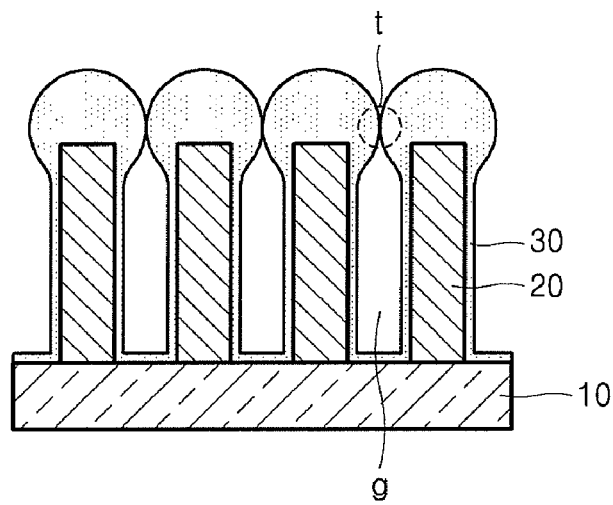
Figure 1C:
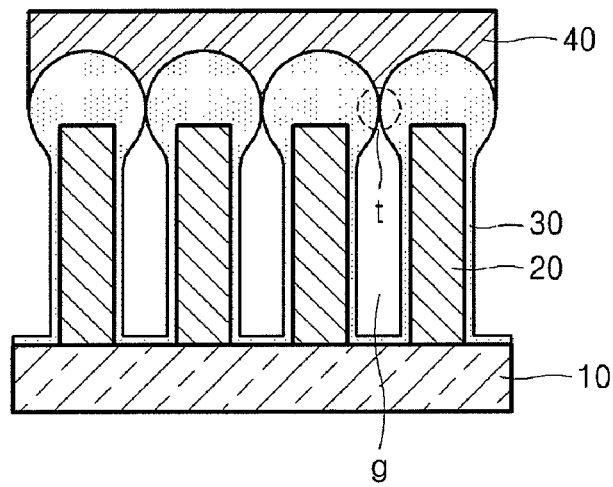

FIGS. 1A to 1C are cross-sectional views of a method of fabricating a semiconductor device, according to an exemplary embodiment of the present invention. As shown in FIG. 1, a plurality of wirings 20 are arranged close to one another on a semiconductor substrate 10. A variety of members, such as sources/drains of various transistors, capacitors and diodes, which are electrically connected to the wirings 20 are arranged in and/or on the semiconductor substrate 10 under the wirings 20.

As shown in FIG. 1B, to electrically isolate the wirings 20, an insulating layer 30 fills the upper portion t of a space between the wirings 20 and has an air gap g. When the upper portion t of the space is completely filled, the air gap g is closed. The insulating layer 30 is formed using, for example, a thermal chemical vapor deposition (thermal CVD) method. As it is well known in the technical field to which the present invention pertains, the insulating layer 30 having the air gap g may be formed by controlling the diffusivity of a reaction gas and the deposition rate by controlling deposition factors such as, for example, gas flow rates, deposition pressure and the temperature of a deposition chamber.

In some exemplary embodiments, the dielectric layer 30 may be formed of, for example, a silicon oxide film. Alternately, an insulating layer may be formed of a material having a dielectric constant lower than that of the silicon oxide film to reduce parasitic capacitance. For example, an insulating layer having a low dielectric constant (herein after, referred to as a low k dielectric) may be formed of materials including at least one of silicon fluoride oxide (SiOF), silicon carbon oxide (SiOC), silicon boron nitride (SiBN), and silicon boron carbon nitride (SiBCN).

In some exemplary embodiments, the insulating layer 30 may be formed by, for example, a low pressure chemical vapor deposition (LPCVD) method in which the deposition pressure may be about 0.3 Torr to about 10 Torr, and the deposition temperature may be about 400° C. to about 600° C. For example, the insulating layer of a silicon oxide may be formed in the LPCVD method using a mixed gas of a silicon-containing gas such as diethylsilane (DES) and a oxygen-containing gas such as $O_2$, $O_3$, NO, $N_2O$, and $H_2O$.

A silicon oxide film having an air gap may be formed by, for example, significantly increasing the partial pressure ratio of oxygen to silicon $P_O/P_{Si}$ to be about 5 to about 50. As the partial pressure of oxygen containing gas with respect to the silicon containing gas increases in the LPCVD method, step coverage of a silicon oxide film may be deteriorated so that the air gap can be readily formed. In this case, by maintaining the deposition temperature at a relatively high temperature of about 400° C. to about 600° C., impurities induced from the reaction gas such as, for example, DES, particularly hydrogen, may be prevented from being included in the dielectric layer 30. The above-described deposition pressure, deposition temperature, and reaction gas are exemplary and the present invention is not limited thereto, and thus, the deposition pressure, deposition temperature, reaction gas may be varied according to the material of the insulating layer 30.

After the insulating layer 30 is formed, as shown in FIG. 1C, a protection layer 40 may be further formed on the insulating layer 30 to reinforce the mechanical and thermal characteristics of the insulating layer 30, and may be, for example, a tetra-ethyl ortho-silicate (TEOS) film formed by a Plasma Enhanced Chemical Vapor Deposition (PECVD) method, a siloxane film or a spin-on-glass (SOG) of silicate. In some exemplary embodiments, after the protection layer 40 is formed, a step of leveling the protection layer 40 using, for example, an etchback process or mechanical and chemical polishing (CMP) process may be further performed.

Compared to the PECVD method that is conventionally adopted to form an air gap, the insulating layer 30 deposited by the LPCVD method according to the present exemplary embodiment may include a lesser amount of impurities such as, for example, hydrogen originating from a reaction gas. More specifically, as the conventional TEOS film formed by using the PECVD method is deposited at a relatively low temperature, for example, about 350° C., a large amount of hydrogen as the impurity is included in the dielectric layer. The hydrogen is dispersed into an active region or a gate stack so as to deteriorate the reliability of a semiconductor device. However, with exemplary embodiments of the present invention, as the dielectric layer is deposited at a high temperature in the thermal CVD method as compared to the PECVD method, even when the dielectric layer is formed using a reaction gas containing hydrogen, the hydrogen is included in a lesser amount in the dielectric layer in comparison to the conventional art so that the reliability of a semiconductor device may be improved.

Figure 2A:
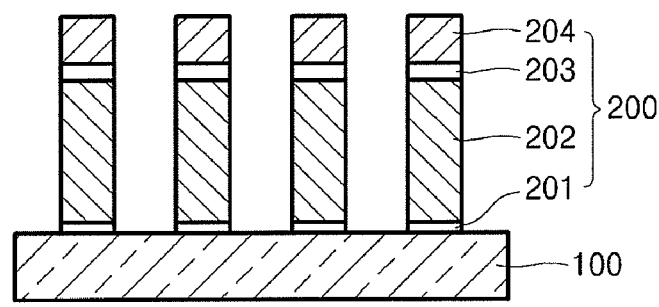
FIGS. 2A to 2C are cross-sectional views of a method of fabricating a semiconductor device, according to an exemplary embodiment of the present invention.
Figure 2B:
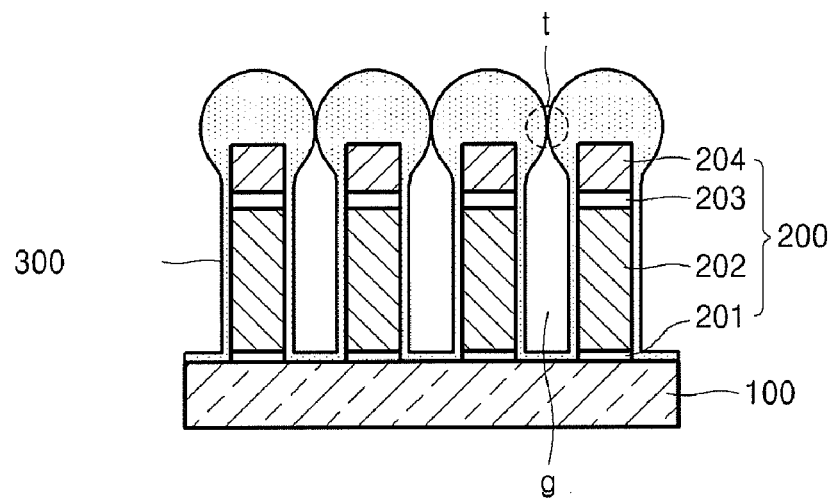
Figure 2C:
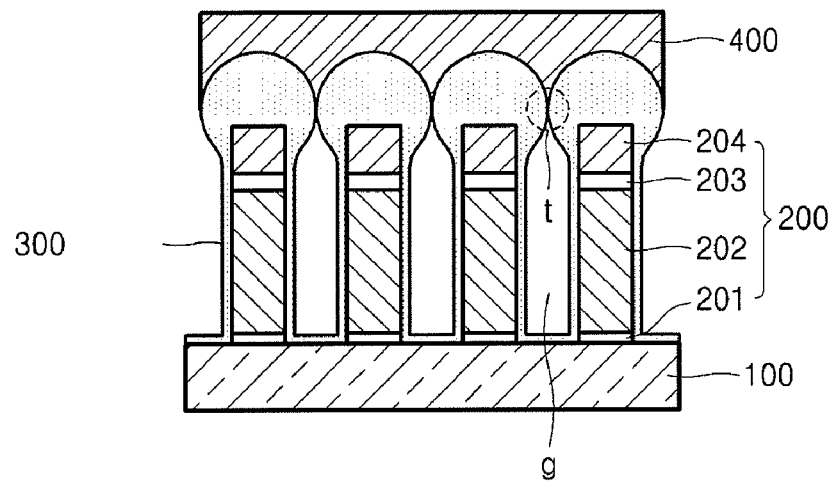

FIGS. 2A to 2C are cross-sectional views of a method of fabricating a semiconductor device, according to another exemplary embodiment of the present invention.

Referring to FIG. 2A, a semiconductor substrate 100 having a channel region is prepared. A plurality of gate stacks 200, each comprising a multilayer film, are formed on the channel region. In one exemplary embodiment of the present invention, to implement a transistor for a logic device or a memory cell for a memory device, the multilayer film may include, for example, a gate dielectric layer and a gate electrode sequentially deposited on an active region of the semiconductor substrate 100. Optionally, to implement a nonvolatile memory device such as a flash memory, the multilayer film may include, for example, a tunneling oxide film 201, a charge storage layer 202, a blocking dielectric film 203, and a control gate electrode 204, as shown in FIG. 2A. The charge storage layer 202 may be a floating gate or charge trap layer, as it is well known in the technical field to which the present invention pertains.

Subsequently, as shown in FIG. 2B, dielectric layer 300 which fills the upper portions of spaces between the neighboring gate stacks 200 to form air gaps g, is formed by, for example, the thermal CVD method. The dielectric layer 300 is so thinly deposited on the sidewall of the gate stack 200 and an exposed portion of the active region of the semiconductor substrate 100 that the dielectric layer 300 functions as a spacer to protect the sidewall of the gate stack 200 and the active region.

As described above, the dielectric layer 300 is formed by controlling deposition variables, such as, for example, the deposition pressure and temperature. In some exemplary embodiments, the dielectric layer 300 may be formed using, for example, the LPCVD method. For example, a silicon oxide film having an air gap g may be formed at a deposition pressure of about 0.3 Torr to about 10 Torr and a deposition temperature of about 400° C. to about 600° C. using a silicon-based gas such as DES and a oxygen-based gas such as $O_2$, $O_3$, NO, $N_2O$, and $H_2O$ while controlling the partial pressure ratio of oxygen with respect to that of the silicon atom, that is, $P_O/P_{Si}$, to be between about 5 and about 50.

In some exemplary embodiments, after the dielectric layer 300 is formed, as shown in FIG. 2C, a protection layer 400 may be further formed on the dielectric layer 300. The protection layer 400 can improve the mechanical and thermal characteristics of the dielectric layer 300 and may be, for example, a TEOS film formed by a PECVD method or a spin-on-glass (SOG) formed of siloxanes or silicate. In some exemplary embodiments, after the protection layer 400 is formed, a step of planarizing the protection layer 400 using, for example, an etchback or CMP method may be further performed.

Compared to the conventional PECVD method, the dielectric layer deposited by the thermal CVD method according to the present exemplary embodiment may include a lesser amount of impurities originating from a reaction gas. Accordingly, the reliability of a semiconductor device may not deteriorate. Also, in view that the operation voltage of an electrical device such as logic devices or memory devices is continuously decreased, the thickness of a gate dielectric layer or tunneling dielectric layer may be gradually reduced. Thus, as the conventional PECVD method deposits a dielectric layer using electrical energy, a thin dielectric layer, for example, a gate dielectric layer and/or tunneling dielectric layer in a gate stack can be readily plasma damaged when exposed to the plasma. However, In the thermal CVD method of exemplary embodiments of the present invention, as the dielectric layer is formed by thermal energy, the gate dielectric layer and/or tunneling dielectric layer can be less damaged or remain intact.

As described above, with the method of fabricating a semiconductor device according to the above-described exemplary embodiments of the present invention, by depositing an dielectric layer for an isolation of wirings in a thermal chemical vapor deposition method that is performed at a relatively high temperature, impurities that are induced from a reaction gas and dispersed in a subsequent process can be included in lesser amounts in the dielectric layer in comparison to the conventional art. Thus, the reliability of the overall semiconductor device may be improved.

Also, according to the method of fabricating a semiconductor device according to the above-described exemplary embodiments of the present invention, as a dielectric layer is formed by a thermal chemical vapor deposition method, damage to the dielectric layer in a gate stack, like the one that occurs in the process of forming an dielectric layer in a conventional PECVD method, can be prevented. Thus, a method of fabricating a semiconductor device having a improved reliability can be provided.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, the method comprising:
   providing a semiconductor substrate including a channel region;
   forming a plurality of adjacent gate stacks, each of the adjacent gate stacks comprising multilayer films on the channel region; and
   forming a dielectric layer filling an upper portion of a space between the adjacent gate stacks to form air gaps by a thermal chemical vapor deposition method and wherein the dielectric layer is formed directly on a sidewall of at least one of the gate stacks and directly on a portion of the semiconductor substrate located on the channel region adjacent to at least one of the gate stacks to function as a spacer to protect the sidewall of the at least one of the gate stacks and the channel region.

2. The method of claim 1, wherein the thermal chemical vapor deposition method comprises a low pressure chemical vapor deposition method.

3. The method of claim 2, wherein the low pressure chemical vapor deposition method is performed at a pressure of about 0.3 Torr to about 10 Torr.

4. The method of claim 1, further comprising forming a protection layer on the dielectric layer.

5. The method of claim 4, further comprising planarizing the protection layer.

6. The method of claim 1, wherein the dielectric layer comprises a low k dielectric layer.

7. The method of claim 6, wherein the low k dielectric layer comprises at least one of silicon fluoride oxide (SiOF), a silicon carbon oxide (SiOC), a silicon boron nitride (SiBN), and a silicon boron carbon nitride (SiBCN).

8. The method of claim 1, wherein the thermal chemical vapor deposition method uses a mixed gas of a silicon-based gas and a oxygen-based gas.

9. The method of claim 1, wherein the silicon-based gas comprises diethylsilane (DES) and the oxygen-based gas comprises any one of $O_2$, $O_3$, NO, $N_2O$, and $H_2O$ or a combination thereof.

10. The method of claim 1, wherein the multilayer films comprise a tunneling dielectric layer, a charge storage layer, a blocking dielectric layer, and a control gate which are sequentially deposited on the channel region.

11. The method of claim 1, wherein the dielectric layer is formed directly on both sidewalls of each of the gate stacks and directly on a portion of the semiconductor substrate located on the channel region between each of the gate stacks.

12. The method of claim 11, wherein the dielectric layer is further formed directly on a top surface of each of the gates stacks and wherein the dielectric layer completely fills the upper portion of the space between each of the gate stacks to thereby provide closed air gaps between each of the gate stacks.

* * * * *